United States Patent

Belt

[19]

[11] Patent Number: 5,974,471
[45] Date of Patent: Oct. 26, 1999

[54] COMPUTER SYSTEM HAVING DISTRIBUTED COMPRESSION AND DECOMPRESSION LOGIC FOR COMPRESSED DATA MOVEMENT

[75] Inventor: Steve Belt, Pflugerville, Tex.

[73] Assignee: Advanced Micro Devices, Inc., Sunnyvale, Calif.

[21] Appl. No.: 08/684,701

[22] Filed: Jul. 19, 1996

[51] Int. Cl.[6] ........................................ G06F 5/00
[52] U.S. Cl. ................................. 710/1; 709/247
[58] Field of Search .................... 395/821, 822, 395/825, 882, 200.68, 200.76, 200.77, 888

[56] References Cited

U.S. PATENT DOCUMENTS

| | | | |
|---|---|---|---|
| 4,008,460 | 2/1977 | Bryant et al. . | |
| 4,688,108 | 8/1987 | Cotton et al. | 358/261.1 |
| 4,881,075 | 11/1989 | Weng | 341/87 |
| 5,237,460 | 8/1993 | Miller et al. . | |
| 5,247,638 | 9/1993 | O'Brien et al. . | |
| 5,247,646 | 9/1993 | Osterlund et al. . | |
| 5,353,425 | 10/1994 | Malamy et al. | 711/144 |
| 5,357,614 | 10/1994 | Pattisam et al. | 395/888 |
| 5,396,343 | 3/1995 | Hanselman | 358/426 |
| 5,420,696 | 5/1995 | Wegeng et al. . | |
| 5,455,577 | 10/1995 | Slivka et al. . | |
| 5,515,511 | 5/1996 | Nguyen et al. | 709/247 |
| 5,548,742 | 8/1996 | Wang et al. | 711/128 |
| 5,563,595 | 10/1996 | Strohacker | 341/106 |
| 5,584,008 | 12/1996 | Shimada et al. | 711/114 |
| 5,606,428 | 2/1997 | Hanselman | 358/404 |
| 5,627,995 | 5/1997 | Miller et al. | 395/888 |
| 5,696,912 | 12/1997 | Bicevskis et al. | 710/128 |
| 5,784,650 | 7/1998 | Gulick et al. | 395/882 |
| 5,812,817 | 9/1998 | Hovis et al. | 711/173 |
| 5,828,877 | 10/1998 | Pearce et al. | 709/100 |
| 5,838,996 | 11/1998 | Decarmo | 395/888 |
| 5,845,088 | 12/1998 | Lewis | 709/247 |

OTHER PUBLICATIONS

A Chip Set for Lossless Image Compression by Shah et al., IEEE 1991.

Chip Set for High Performance Lossless Image Compression and Entropy Coding by Vendrux et al., IEEE 1992.

*Primary Examiner*—Robert W. Beausoliel, Jr.
*Assistant Examiner*—Pierre Eddy Elisca
*Attorney, Agent, or Firm*—Conley, Rose & Tayon; Robert C. Kowert

[57] ABSTRACT

A computer system having distributed compression and decompression logic for compressed data movement within the computer system. This provides increased efficiency and reduced bus bandwidth requirements. The computer system includes various standard components, including a CPU, chip set logic, main memory, one or more expansion buses, and various peripheral devices coupled to the expansion buses. Various devices may be connected to the PCI bus, including graphics accelerator hardware, audio logic, a hard drive, and a network interface card, and other multimedia devices, as desired. In the preferred embodiment, the bridge logic and/or memory controller, one or more of the multimedia devices, the hard drive, and the network interface controller each includes compression/decompression (codec) logic which performs compression and decompression operations. Thus, when a device desires to perform a transfer on the bus, the codec in the device preferably compresses the data before transferring the data onto the bus. The receiving or destination device includes codec logic which receives the compressed data and decompresses the data, and the decompressed data is then used or stored by the device. Thus, the majority of data transfers on the bus are compressed data transfers, i.e., comprise transfers of compressed data. This optimizes or reduces the required bus transfer bandwidth.

22 Claims, 4 Drawing Sheets

COMPUTER SYSTEM HAVING DISTRIBUTED COMPRESSION AND DECOMPRESSION LOGIC FOR COMPRESSED DATA MOVEMENT

FIELD OF THE INVENTION

The present invention relates to a computer system having distributed compression and decompression logic comprised in the system for compressed data movement within the computer system, thus providing increased efficiency and reduced bus bandwidth requirements.

DESCRIPTION OF THE RELATED ART

Computer architectures generally include a plurality of devices interconnected by one or more various buses. For example, modern computer systems typically include a CPU coupled through bridge logic to main memory. The bridge logic also typically couples to a high bandwidth local expansion bus, such as the peripheral component interconnect (PCI) bus or the VESA (Video Electronics Standards Association) VL bus. Examples of devices which can be coupled to local expansion buses include video accelerator cards, audio cards, telephony cards, SCSI adapters, network interface cards, etc. An older type expansion bus is generally coupled to the local expansion bus. Examples of such expansion buses included the industry standard architecture (ISA) bus, also referred to as the AT bus, the extended industry standard architecture (EISA) bus, or the microchannel architecture (MCA) bus. Various devices may be coupled to this second expansion bus, including a fax/modem, sound card, etc.

Personal computer systems were originally developed for business applications such as word processing and spreadsheets, among others. However, computer systems are currently being used to handle a number of real time applications, including multimedia applications having video and audio components, video capture and playback, telephony applications, and speech recognition and synthesis, among others. These real time applications typically require a large amount of system resources and bandwidth.

One problem that has arisen is that computer systems originally designed for business applications are not well suited for the real-time requirements of modern multimedia applications. For example, modem personal computer system architectures still presume that the majority of applications executing on the computer system are non real-time business applications such as word processing and/or spreadsheet applications, which execute primarily on the main CPU. In general, computer systems have not traditionally been designed with multimedia hardware as part of the system, and thus the system is not optimized for multimedia applications.

Computer systems which include multimedia hardware are generally required to transfer large amounts of real time or multimedia data between various components. For example, multimedia hardware is typically designed as an add-in card for optional insertion in an expansion bus of the computer system. Multimedia hardware cards situated on an expansion bus are required to access system memory and other system resources for proper operation. These data transfers occur on the one or more buses within the system. Thus, bus bandwidth constraints limit the rate of multimedia data transfers. Therefore, an improved computer system architecture is desired which provides increased bandwidth for multimedia data transfers and other data transfers.

SUMMARY OF THE INVENTION

The present invention comprises a computer system having distributed compression and decompression logic for compressed data movement within the computer system. This provides increased efficiency and reduced bus bandwidth requirements.

The computer system includes a CPU coupled through chip set or bridge logic to main memory. The bridge logic includes memory controller logic which couples to the main memory. The bridge logic also couples to a local expansion bus such as the PCI bus. Various devices may be connected to the PCI bus, including graphics accelerator hardware, audio logic, a hard drive, and a network interface card, and other multimedia devices, as desired.

In the preferred embodiment, the bridge logic and/or memory controller includes compression /decompression (codec) logic which performs compression and decompression operations. One or more of the multimedia devices, the hard disk, and the network interface controller also each preferably include codec logic which performs compression and decompression operations. Thus, when a device desires to perform a transfer on the bus, the codec in the device preferably compresses the data before transferring the data onto the bus. The receiving or destination device includes codec logic which receives the compressed data and decompresses the data, and the decompressed data is then used or stored by the device. Thus, the majority of data transfers on the bus are compressed data transfers, i.e., comprise transfers of compressed data. This optimizes or reduces the required bus transfer bandwidth.

For example, if a transfer is required from the memory to the graphics accelerator, the codec in the memory controller first compresses the data to be transferred, and the compressed data is transferred across the PCI bus to the graphics accelerator. The codec in the graphics accelerator receives the compressed data and decompresses the data. The decompressed data may then be used by the graphics accelerator.

Therefore, the present invention comprises a novel computer system architecture which provides improved efficiency for data transfers and increases the performance of real-time applications. The present invention is also optimized for real-time applications and provides increased performance over current computer architectures. The computer system of the present invention thus provides much greater performance for real-time and multimedia applications than prior systems.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Incorporation by Reference

*PCI System Architecture* by Tom Shanley and Don Anderson and available from Mindshare Press, 2202 Buttercup Dr., Richardson, Tex. 75082 (214) 231–2216, is hereby incorporated by reference in its entirety.

The Intel Peripherals Handbook, 1994 and 1995 editions, available from Intel Corporation, are hereby incorporated by reference in their entirety. Also, data sheets on the Intel 82430FX PCIset chipset, also referred to as the Triton chipset, are hereby incorporated by reference in their entirety, including the 82430 Cache Memory Subsystem data sheet (Order No. 290482-004), the 82420/82430 PCIset ISA and EISA bridge data sheet (Order No. 290483-004), and the Intel 82430FX PCIset Product Brief (Order No. 297559-001), all of which are available from Intel Corporation, Literature Sales, P.O. Box 7641, Mt. Prospect, Ill. 60056-7641 (1-800-879-4683), and all of which are hereby incorporated by reference in their entirety.

Figure 1:
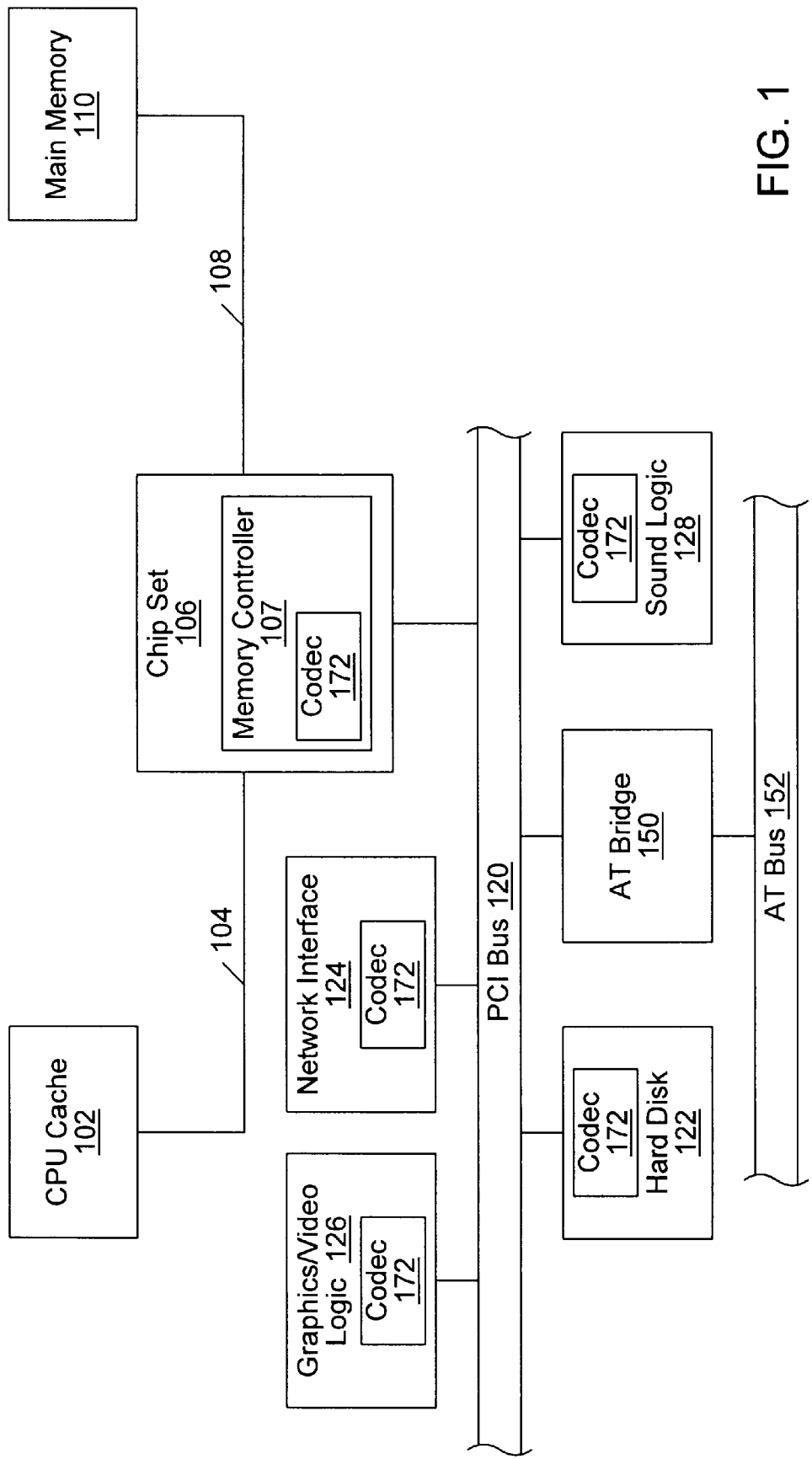
FIG. 1 is a block diagram of a computer system including distributed codec logic according to the present invention.

FIG. 1—Computer System Block Diagram

Referring now to FIG. 1, a block diagram of a computer system according to the present invention is shown. As shown, the computer system includes a central processing unit (CPU) 102 which is coupled through a CPU local bus 104 to a host/PCI/cache bridge or chipset 106. The chipset 106 includes memory controller logic 107 as shown. The memory controller logic 107 includes compression/decompression (codec) logic 172 according to the invention.

The chipset 106 is preferably similar to the Triton chipset available from Intel Corporation. The chipset 106 includes various peripheral logic, including one or more of an interrupt system, a real time clock (RTC) and timers, a direct memory access (DMA) system, and ROM/Flash memory (all not shown). The chipset 106 may also include various other peripheral logic, including communications ports, diagnostics ports, command/status registers, and non-volatile static random access memory (NVSRAM).

A second level or L2 cache memory (not shown) may be coupled to a cache controller in the chipset, as desired. The bridge or chipset 106 couples through a memory bus 108 to main memory 110. The main memory 110 is preferably DRAM (dynamic random access memory) or EDO (extended data out) memory, as desired.

The host/PCI/cache bridge or chipset 106 interfaces to a peripheral component interconnect (PCI) bus 120. In the preferred embodiment, a PCI local bus is used. However, it is noted that other local buses may be used, such as the VESA (Video Electronics Standards Association) VL bus. Various types of devices, including multimedia devices, may be connected to the PCI bus 120.

In the embodiment shown in FIG. 1, a video/graphics card 126 and a sound card 128 are coupled to the PCI bus 120. The video/graphics card 126 preferably performs video functions and graphics accelerator functions. The video/graphics card 126 may also perform 2-D and 3-D accelerator functions. The video/graphics card 126 preferably includes a video port for coupling to a video monitor (not shown). The sound card 128 performs audio processing functions. The sound card 128 includes an audio digital to analog converter (audio DAC) (not shown) which couples to an audio port, wherein the audio port is adapted for coupling to speakers (not shown).

A hard disk 122 and a network interface controller 124 are also shown coupled to the PCI bus 120. A SCSI (small computer systems interface) adapter may also be coupled to the PCI bus 120, as shown. The SCSI adapter may couple to various SCSI devices, such as a CD-ROM drive and a tape drive (both not shown), as desired. Various other devices may be connected to the PCI bus 120, as is well known in the art.

In the embodiment of FIG. 1, the video/graphics logic 126, the sound logic 128, and the hard disk 122 include codec logic 172 according to the invention. The network interface controller 124 also includes codec logic 172 according to the invention.

Expansion bus bridge logic 150 is also preferably coupled to the PCI bus 120. The expansion bus bridge logic 150 interfaces to an expansion bus 152. The expansion bus 152 may be any of varying types, including the industry standard architecture (ISA) bus, also referred to as the AT bus, the extended industry standard architecture (EISA) bus, or the microchannel architecture (MCA) bus. Various devices may be coupled to the expansion bus 152, such as expansion bus memory or a modem (both not shown).

FIGS. 2–6

Figure 4:
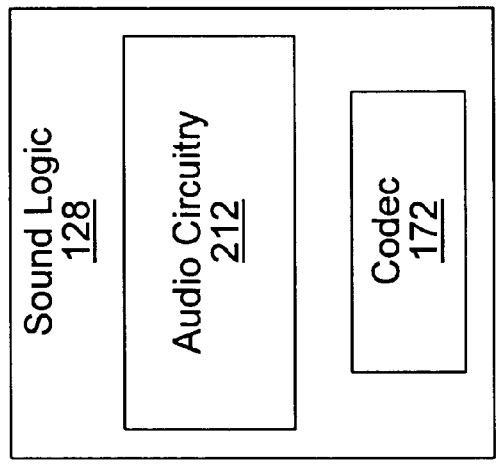
FIG. 4 is a block diagram of the sound logic in the computer system of FIG. 1.
Figure 3:
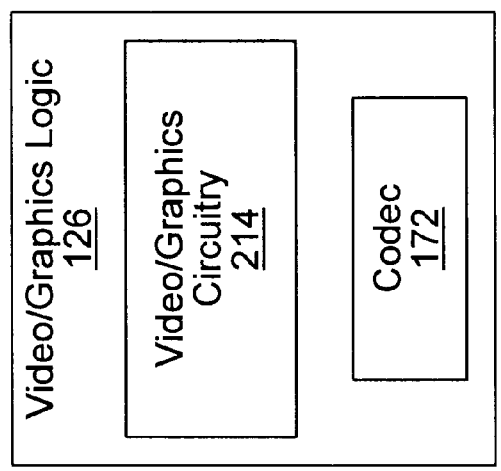
FIG. 3 is a block diagram of the video/graphics logic in the computer system of FIG. 1.
Figure 2:
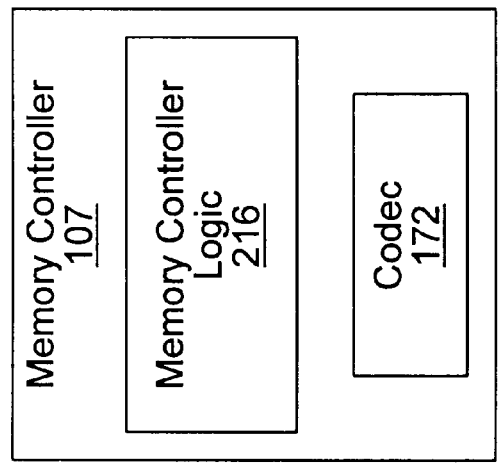
FIG. 2 is a block diagram of the memory controller in the bridge logic of FIG. 1.
Figure 6:
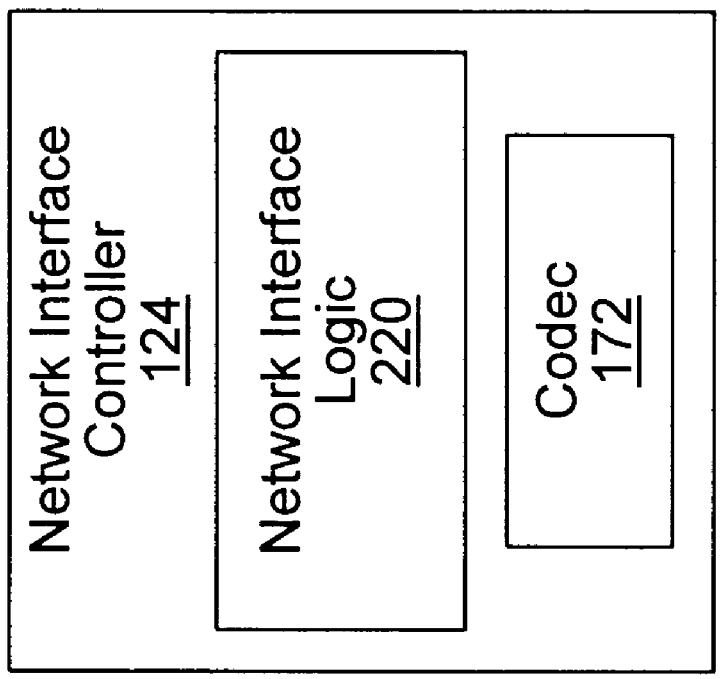
FIG. 6 is a block diagram of the network interface controller in the computer system of FIG. 1.
Figure 5:
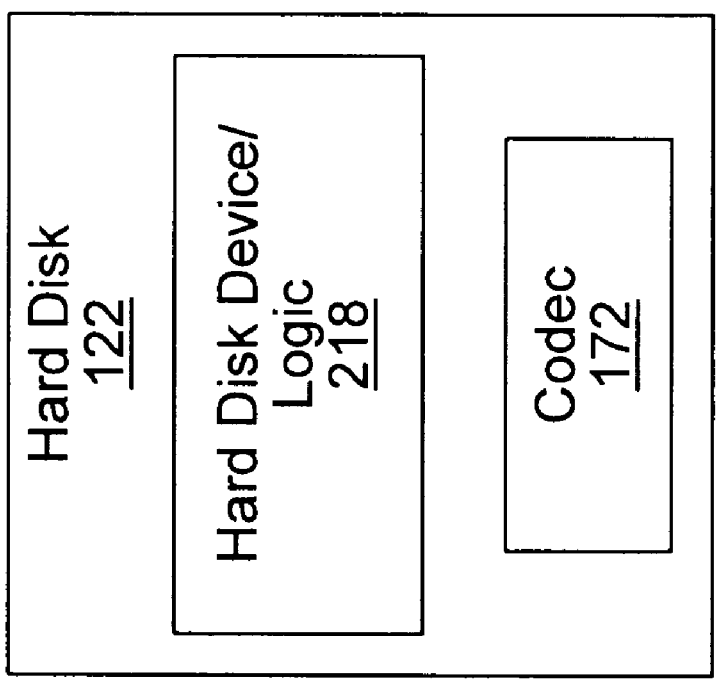
FIG. 5 is a block diagram of the hard disk in the computer system of FIG. 1.

FIGS. 2–6 illustrate various devices which include codec logic 172 according to the preferred embodiment of the present invention. FIG. 2 illustrates the memory controller 107, wherein the memory controller 107 includes codec logic 172 and memory controller logic 216, as shown. FIG. 3 illustrates the video/graphics logic 126, wherein the video/graphics logic 126 includes codec logic 172 and video/graphics circuitry 214, as shown. FIG. 4 illustrates the sound logic 128, wherein the sound logic 128 includes codec logic 172 and audio circuitry 212, as shown. FIG. 5 illustrates the hard disk 122, wherein the hard disk 122 includes codec logic 172 and hard disk logic 218, as shown. FIG. 6 illustrates the network interface controller 124, wherein the network interface controller 124 includes codec logic 172 and network interface logic 220, as shown.

It is noted that various other devices may include codec logic 172 for performing and/or receiving compressed data transfers, including modem cards, telephony cards, other storage devices such as CD-ROM or DVD (digital video disk) drives, and other multimedia devices, as desired. The CPU 102 may also include codec logic 172 or execute software which enables data compression.

The codec logic 172 in each device is preferably programmed at boot time as to which devices also include codec logic 172. The codec logic 172 in each device thus preferably maintains a data structure which indicates which of the devices comprised in the system includes codec logic. Information about which devices include codec information is preferably incorporated into the system "Plug and Play" information. For more information on the "Plug and Play" standard, please see the Plug and Play BIOS Specification, Version 1.0a and the Plug and Play ISA Specification, version 1.0A, which are hereby incorporated by reference. Each codec 172 preferably uses "Plug and Play" information received from the system to maintains its data structure.

Thus a device which includes codec logic 172 ensures that it only transfers compressed data to another device which also includes codec logic 172. Alternatively, a device which includes codec logic 172 polls the destination device prior to a transfer to determine if the device includes codec logic 172. If a first device which includes codec logic 172 desires to transfer data to a second device which does not include codec logic 172, the first device must perform the transfer in a non-compressed fashion, since the receiving device will not understand and cannot decompress the receive data.

Distributed Codecs

Referring again to FIG. 1, as described above one or more of the devices or components comprised in the computer system includes distributed compression/decompression (codec) logic 172 for performing compression and decompression operations. The codecs may use any of various types of lossless compression algorithms, including the Liv-Zempel (LZ) compression algorithm, or other lossless compression algorithms. It is noted that each of the devices preferably use the same compression algorithm, or each group understands a common set of compression algorithms, for interoperability.

Thus, when a device desires to perform a transfer on the bus, the codec in the device preferably compresses the data before transferring the data onto the bus. The receiving or destination device includes codec logic which receives the compressed data and decompresses the data, and the decompressed data is then used or stored by the device. Thus, the majority of data transfers on the bus are compressed data transfers, i.e., comprise transfers of compressed data. This optimizes or reduces the required bus transfer bandwidth.

In the preferred embodiment, the memory controller 107 includes compression/decompression (codec) logic 172 which performs compression and decompression operations. Thus, as data is retrieved from the main memory 110, the data can be compressed prior to transfer across the PCI bus 120 to another device. Also, the codec 172 in the memory controller 107 can operate to store data in the memory in a compressed format, thus allowing more efficient use of the system memory 110. If data stored in a compressed format in the memory 110 is requested by the CPU 102, the data is preferably decompressed by the codec 172 in the memory controller 107 prior to transfer to the CPU 102. If data stored in a compressed format in the memory 110 is requested by another device which includes a codec 172 according to the present invention, the data is preferably transferred from the memory 110 directly to the requesting device in the compressed format, and the requesting device can then decompress the received compressed data.

One or more of the multimedia devices also preferably include codec logic 172 which performs compression and decompression operations. In the embodiment of FIG. 1, the video/graphics card 126 and the sound card 128 each include codec logic 172 for performing compression and decompression operations. Thus, multimedia data transfers occur on the PCI bus 120, or other buses, in a compressed format.

In addition, in the embodiment of FIG. 1, the hard disk 122 also includes codec logic 172 for performing compression and decompression operations. In this manner, the hard disk 122 can store data in a compressed format and/or transfer data in a compressed format. This use of hardware compression logic 172 in the hard drive 122 allows fast and efficient data compression of data stored on the hard drive without involving the host CPU 102. This differs from the use of software compression programs, such as "Stacker", which execute on the computer CPU 102 to compress data on the hard drive. Software compression programs unnecessarily burden the host CPU and thus reduce system performance. In contrast, the present invention performs compression in hardware, and thus does not require host CPU cycles for compression or decompression operations.

As an example of the operation of the present invention, if a transfer is required from the memory 110 to the video/graphics card 126, and the data is stored in the memory 110 in a non-compressed format, the codec 172 in the memory controller 107 first compresses the data to be transferred, and the compressed data is transferred across the PCI bus 120 to the video/graphics card 126. The codec in the graphics accelerator 126 receives the compressed data and decompresses the data. The decompressed data may then be used by the graphics accelerator 126.

Likewise, if a transfer is required from a device having codec logic 172, such as the video/graphics card 126, the sound card 128, or the hard disk 122, to the memory 110, the codec 172 in the respective device first compresses the data to be transferred, and the compressed data is transferred across the PCI bus 120 to the memory controller 107. The codec in the memory controller 107 receives the compressed data and decompresses the data. The decompressed data may then be stored in the memory 110 for use by the CPU 102 or other devices. The memory controller 107 may also store the data in the main memory 110 in a compressed format as described above.

In the preferred embodiment, the network interface controller 124 also includes codec logic 172 for compressing data during transfers. In the preferred embodiment, when the network interface controller 124 receives data that is in a compressed format from other logic in the computer system, and the data is destined for another computer on the network, such as a file or application server or another client node, and the destination computer also includes codec logic 172 according to the present invention, then the network interface controller 124 preferably maintains the data in a compressed format for the transfer, i.e., does not decompress the data prior to the transfer. In this fashion, data is transferred through the network in a compressed format.

If the network interface controller 124 receives data that is in a non-compressed format from other logic in the computer system, and the data is destined for another computer on the network which includes codec logic 172 according to the present invention, then the network interface controller 124 preferably compresses the data and transfers the data across the network in a compressed format.

In a similar manner, if the network interface controller 124 receives data that is in a compressed format from another computer on the network, and the data is destined for other logic in the computer system which includes codec logic 172 according to the present invention, then the network interface controller 124 preferably maintains the data in a compressed format for the transfer, i.e., does not decompress the received data prior to the transfer to the respective device in the computer system. Likewise, if the network interface controller 124 receives data that is in a non-compressed format from another computer on the network, and the data is destined for other logic in the computer system which includes codec logic 172 according to the present invention, then the network interface controller 124 preferably compresses the data and transfers the data to the respective device in a compressed format.

Figure 7:
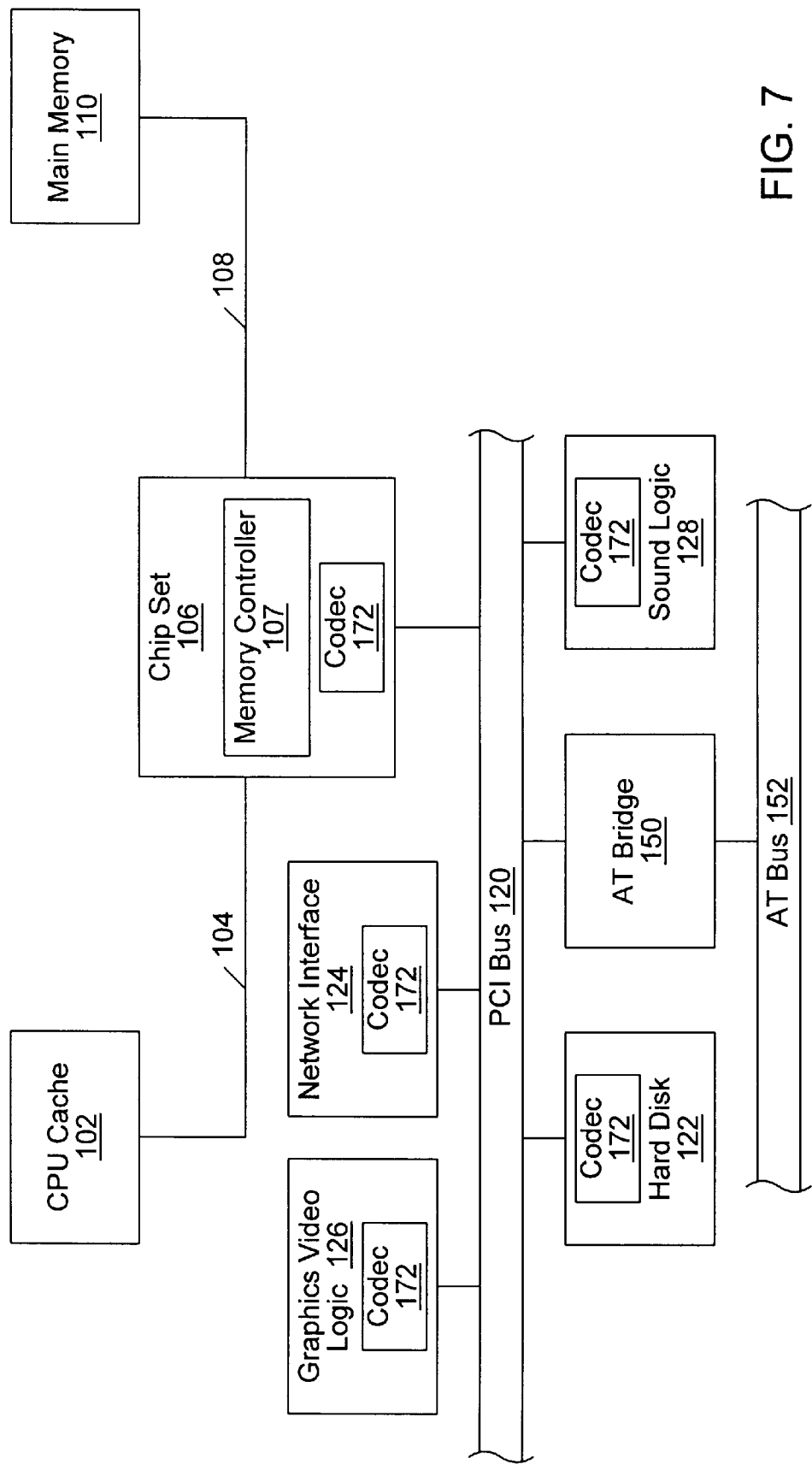
FIG. 7 is a block diagram of an alternate embodiment of a computer system including distributed codec logic according to the present invention.

FIG. 7—Alternate Embodiment

Referring now to FIG. 7, in an alternate embodiment of the invention, a codec 172 is comprised in the chipset 106 separate from the memory controller 107. In this embodiment, the codec 172 operates to compress data transfers from both the CPU 102 and the memory 110 which are destined for a device on the PCI bus 120, or other bus, which includes codec logic 172. Thus, in this embodiment, transfers from the CPU 102 to a device on the PCI bus 120 which includes a codec 172 are compressed by the codec 172 comprised in the chipset 106, and thus the data is transferred on the PCI bus 120 in a compressed format. Likewise, transfers from a device on the PCI bus 120 which includes a codec 172 to the CPU 102 are transferred on the PCI bus 120 in a compressed format, and the codec 172 comprised in the chipset 106 decompresses the data before transfer to the CPU 102.

Conclusion

Therefore, the present invention comprises a novel computer system architecture which includes distributed codec logic for more efficient bus data transfers. The present invention provides improved efficiency for data transfers and increases the performance of real-time applications. The computer system of the present invention thus provides greater performance for real-time and multimedia applications than prior systems.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A computer system which includes distributed compression/decompression (codec) logic for improved data transfers, comprising:

a CPU;

a main memory coupled to the CPU which stores data accessible by the CPU;

a chip set logic coupled to the CPU, and a memory bus;

an expansion bus coupled to the chipset logic, wherein the expansion bus is adapted for transferring data;

a plurality of peripheral devices coupled to the expansion bus and configured to transfer data on the expansion bus, wherein each of said plurality of peripheral devices includes compression/decompression (codec) logic for compressing data prior to transferring data onto the expansion bus, wherein said codec logic in each of said plurality of peripheral devices operates to receive compressed data transferred on said expansion bus and operates to decompress said received compressed data for use by the respective peripheral device.

2. The computer system of claim 1, further comprising:

a memory controller coupled to the main memory for controlling transfers to or from the main memory, wherein the memory controller includes codec logic for compressing data prior to transferring data onto the expansion bus.

3. The computer system of claim 2, wherein the codec logic comprised in the memory controller receives compressed data transferred on said expansion bus and operates to decompress said received compressed data and store said decompressed data in the main memory.

4. The computer system of claim 1, wherein each of said plurality of peripheral devices includes codec detection logic for determining if a destination device includes codec logic.

5. The computer system of claim 1, wherein at least one of said plurality of peripheral devices comprises video logic for performing video operations.

6. The computer system of claim 1, wherein at least one of said plurality of peripheral devices comprises audio logic for performing audio operations.

7. The computer system of claim 1, wherein at least one of said plurality of peripheral devices comprises a network interface controller for coupling to a network, wherein the network interface controller performs network data transfer functions.

8. The computer system of claim 1, wherein at least one of said plurality of peripheral devices comprises a hard disk device for storing data.

9. The computer system of claim 1, wherein each of said codecs in said plurality of peripheral devices implements a lossless compression algorithm.

10. The computer system of claim 1, wherein said expansion bus comprises the Peripheral Component Interconnect (PCI) bus.

11. A computer system, comprising:

a CPU coupled to a CPU local bus;

a chipset coupled to the CPU local bus and to main memory, wherein said chipset interfaces to a peripheral local bus, and wherein the chipset comprises a memory controller and compression/decompression logic for compressing data prior to transferring data onto the peripheral local bus; and a plurality of peripheral devices coupled to the peripheral local bus and configured to transfer data on the peripheral local bus, wherein each of said plurality of peripheral devices includes compression/decompression logic for compressing data prior to transferring data onto the peripheral local bus.

12. The computer system of claim 11, wherein the memory controller retrieves uncompressed data from main memory and the compression/decompression logic comprised within the chipset compresses the uncompressed retrieved data prior to transfer across the peripheral local bus to one of the plurality of peripheral devices.

13. The computer system of claim 11, wherein the memory controller retrieves compressed data from main memory and the chipset transfers the compressed retrieved data across the peripheral local bus to one of the plurality of peripheral devices.

14. The computer system of claim 11, wherein data transfers from the CPU to one of the peripheral devices are compressed by the compression/decompression logic within the chipset prior to transfer across the peripheral local bus.

15. The computer system of claim 11, wherein data transfers from one of the peripheral devices to the CPU are compressed by the compression/decompression logic within the transferring peripheral device prior to transfer across the peripheral local bus and decompressed by the compression/decompression logic within the chipset prior to transfer to the CPU.

16. The computer system of claim 11, wherein one of said peripheral devices comprises a network interface controller for transferring data to another computer on a network, wherein the compression/decompression logic comprised within the network interface controller receives compressed data and decompresses the compressed data prior to transfer across the network.

17. The computer system of claim 11, wherein one of said peripheral devices comprises a network interface controller for transferring data to another computer on a network, wherein the network interface controller receives compressed data and transfers the compressed data across the network.

18. The computer system of claim 11, wherein each compression/decompression logic in each of the plurality of peripheral devices maintains a data structure which indicates which of the other devices in the computer system include compression/decompression logic.

19. The computer system of claim 11, wherein the compression/decompression logic within the chipset maintains a data structure which indicates which of the other devices in the computer system include compression/decompression logic.

20. The computer system of claim 19, wherein the chipset only transfers compressed data to devices which also include compression/decompression logic.

21. The computer system of claim 11, wherein the chipset polls a destination device prior to transferring data to determine if the destination device includes compression/decompression logic so that the chipset transfers compressed data only to devices that include compression/decompression logic.

22. The computer system of claim 11, further comprising system Plug and Play information, wherein information about which device in the computer system includes compression/decompression logic is incorporated in the system Plug and Play information.

* * * * *